(12) United States Patent
 Okada

(10) Patent No.: US 10,937,977 B2
(45) Date of Patent: *Mar. 2, 2021

(54) TOP EMISSION TYPE LIGHT EMITTING ELEMENT

(71) Applicant: PIONEER CORPORATION, Tokyo (JP)

(72) Inventor: Takeru Okada, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/857,080

(22) Filed: Apr. 23, 2020

(65) Prior Publication Data

US 2020/0259109 A1   Aug. 13, 2020

Related U.S. Application Data

(63) Continuation of application No. 16/455,526, filed on Jun. 27, 2019, now Pat. No. 10,665,795, which is a
(Continued)

(51) Int. Cl.
*H01L 51/00* (2006.01)
*H01L 51/52* (2006.01)

(52) U.S. Cl.
CPC ...... *H01L 51/0097* (2013.01); *H01L 51/5246* (2013.01); *H01L 51/5253* (2013.01);
(Continued)

(58) Field of Classification Search
None
See application file for complete search history.

(56) References Cited

U.S. PATENT DOCUMENTS 7,486,017 B2   2/2009   Ohkubo
7,531,957 B2   5/2009   Sakamoto
(Continued)

FOREIGN PATENT DOCUMENTS

GB   2335884 A   10/1999
JP   2001154592 A   6/2001
(Continued)

OTHER PUBLICATIONS

Extended European Search Report for EP App No. 13877233.0 dated Sep. 26, 2016, 11 pgs.
(Continued)

*Primary Examiner* — Nduka E Ojeh
(74) *Attorney, Agent, or Firm* — Procopio, Cory, Hargreaves & Savitch LLP

(57) ABSTRACT

A light emitting element includes a flexible plate-like portion having a glass substrate, and an organic functional layer formed on one surface side of the glass substrate. The organic functional layer includes a light emitting layer. When the plate-like portion is curved in a prescribed curving direction, and one surface of the plate-like portion is a concave surface, and the other surface thereof is a convex surface, a surface which is positioned on the concave surface side among both surfaces of the glass substrate is referred to as a first surface. When the plate-like portion is curved in a curving direction, and the one surface of the plate-like portion is a concave surface, and the other surface thereof is a convex surface, a compressive stress is applied to a portion whose distance from the first surface of the glass substrate is less than or equal to L (L>T/2).

21 Claims, 12 Drawing Sheets

Related U.S. Application Data continuation of application No. 14/772,762, filed as application No. PCT/JP2013/056475 on Mar. 8, 2013, now Pat. No. 10,374,176.

(52) U.S. Cl.
CPC ............... *H01L 2251/5338* (2013.01); *H01L 2251/558* (2013.01); *Y02E 10/549* (2013.01)

(56) References Cited

U.S. PATENT DOCUMENTS

| | | | |
|---|---|---|---|
| 8,237,165 | B2 | 8/2012 | Kim et al. |
| 2006/0028128 | A1 | 2/2006 | Ohkubo |
| 2006/0051888 | A1 | 3/2006 | Koo et al. |
| 2007/0080627 | A1 | 4/2007 | Sakamoto |
| 2009/0096965 | A1* | 4/2009 | Nagata ............... G02F 1/133305 349/103 |
| 2010/0308335 | A1* | 12/2010 | Kim ...................... H01L 51/003 257/59 |
| 2011/0095261 | A1 | 4/2011 | Kazlas et al. |
| 2012/0020056 | A1* | 1/2012 | Yamagata ......... G02F 1/133308 362/97.1 |
| 2012/0235207 | A1 | 9/2012 | Kwack et al. |
| 2013/0148312 | A1* | 6/2013 | Han ....................... H05K 1/028 361/736 |
| 2015/0179722 | A1 | 6/2015 | Koo et al. |
| 2015/0258750 | A1* | 9/2015 | Kang ................ B32B 17/10743 428/174 |
| 2017/0155087 | A1 | 6/2017 | Lee et al. |

FOREIGN PATENT DOCUMENTS

| | | |
|---|---|---|
| JP | 2003168556 A | 6/2003 |
| JP | 2003337549 A | 11/2003 |
| JP | 2005019082 A | 1/2005 |
| JP | 2005251671 A | 9/2005 |
| JP | 2006012785 A | 1/2006 |
| JP | 2006058764 A | 3/2006 |
| JP | 2006221892 A | 8/2006 |
| JP | 2007010834 A | 1/2007 |
| JP | 2008089884 A | 4/2008 |
| JP | 2008097829 A | 4/2008 |
| JP | 2009170173 A | 7/2009 |
| JP | 2010282966 A | 12/2010 |
| JP | 6416307 B2 | 10/2018 |
| KR | 1020100130898 A | 12/2010 |
| KR | 1020120088025 A | 8/2012 |
| WO | 2005027582 A1 | 3/2005 |
| WO | 2009099425 A2 | 8/2009 |

OTHER PUBLICATIONS

Office Action for JP App No. 2015-504099 dated Sep. 13, 2016, 5 pgs.
International Search Report for PCT/JP2013/056475, dated May 28, 2013.
Office Action for KR App No. 201810283680.0, dated May 27, 2019; 7 pages.
Office Action for related CN App No. 201810283680.0 dated May 27, 2019, 7 pgs. (Correcting NPL #4 cite on IDS filed Jun. 27, 2019).
Office Action for related JP App No. 2018-188188 dated Jul. 16, 2019, 4 pgs.
Office Action for related Korean App. No. KR10-2019-7030626 dated Oct. 22, 2019, 5 pages.
Office Action in the related Japanese patent application No. 2019-189351, dated Sep. 24, 2020, Total 2 pages.

\* cited by examiner

TOP EMISSION TYPE LIGHT EMITTING ELEMENT

CROSS-REFERENCE TO RELATED APPLICATIONS

This application is a continuation of U.S. patent application Ser. No. 16/455,526, filed on Jun. 27, 2019, which is a continuation of U.S. patent application Ser. No. 14/772,762, filed on Sep. 3, 2015, which is a U.S. National Stage entry of PCT Application No: PCT/JP2013/056475 filed Mar. 8, 2013, the contents of which are incorporated herein by reference.

TECHNICAL FIELD

The present invention relates to a light emitting element.

BACKGROUND ART

As light emitting elements, there is one including an organic light emitting layer, that is, an organic Electro Luminescence (EL) element. There is a type of the organic EL element which is flexible, that is, an organic EL element which has flexibility and is able to be bent (Patent Documents 1 to 5). There is one type of such a flexible organic EL element of which a base material includes a glass substrate (Patent Documents 1 and 2). The glass substrate is able to prevent moisture or oxygen from being transmitted, compared to a resin layer.

Furthermore, Patent Document 3 discloses a technology in which an inorganic moisture-proof layer is arranged approximately in a center portion in a thickness direction of the organic EL element, thus reducing a stress generated in the inorganic moisture-proof layer. Similarly, Patent Document 4 discloses a technology in which a gas barrier layer formed of silicon oxide, silicon oxynitride, and the like is arranged in the vicinity of a position which is a neutral surface at the time of bending the organic EL element, and thus the generation of the stress in the gas barrier layer is reduced. Similarly, Patent Document 5 discloses a technology in which an inorganic insulating film formed of a silicon oxynitride film or the like is arranged in the vicinity of a neutral axis at the time of applying a bending stress to the organic EL element.

RELATED DOCUMENT

Patent Document

[Patent Document 1] Japanese Unexamined Patent Application Publication No. 2003-337549
[Patent Document 2] Japanese Unexamined Patent Application Publication No. 2007-10834
[Patent Document 3] Japanese Unexamined Patent Application Publication No. 2003-168556
[Patent Document 4] Japanese Unexamined Patent Application Publication No. 2005-251671
[Patent Document 5] Pamphlet of International Publication No. WO 2005/027582

SUMMARY OF THE INVENTION

The glass substrate may easily crack when bent due to properties thereof. For this reason, it is desirable to suppress the cracking of the glass substrate.

An example of an object of the present invention is to suppress cracking of a glass substrate included in a light emitting element.

The invention according to Claim 1 is a light emitting element including a flexible plate-like portion including a glass substrate, and an organic functional layer which includes a light emitting layer, and is formed on one surface side of the glass substrate, in which when the plate-like portion is curved in a prescribed curving direction, and thus one surface of the plate-like portion is a concave surface, and the other surface thereof is a convex surface, a surface positioned on the concave surface side among both surfaces of the glass substrate is referred to as a first surface, and when a thickness of the glass substrate is T, a compressive stress is applied to a portion of the glass substrate whose distance from the first surface of the glass substrate is less than or equal to L (L>T/2) at the time of curving the plate-like portion.

The invention according to Claim 4 is a light emitting element including a flexible plate-like portion including a glass substrate, and an organic functional layer which includes a light emitting layer, and is formed on one surface side of the glass substrate, in which the entire glass substrate is positioned towards one surface side of the plate-like portion than the center of a thickness direction of the plate-like portion.

BRIEF DESCRIPTION OF THE DRAWINGS

The object described above, and other objects, characteristics, and advantages will become more obvious with reference to the following preferred embodiments and the following drawings attached thereto.

DESCRIPTION OF EMBODIMENTS

Figure 1:
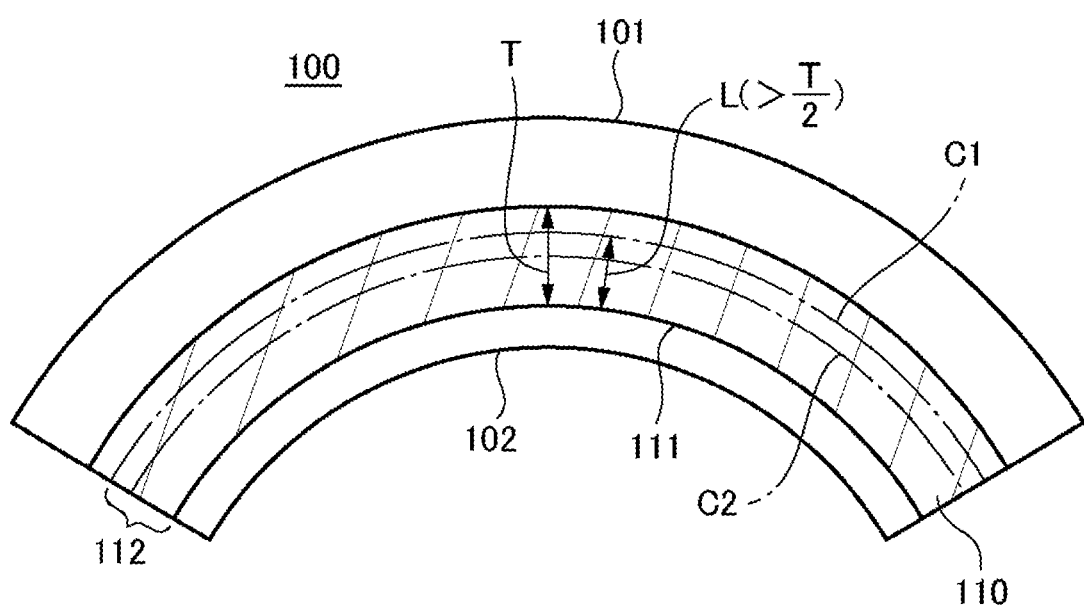
FIG. 1 is a schematic side cross-sectional view of a light emitting element according to an embodiment.

Hereinafter, embodiments of the present invention will be described with reference to the drawings. Furthermore, in all of the drawings, the same reference numerals are applied to the same constituent parts, and the descriptions thereof will not be repeated.

FIG. 1 is a side cross-sectional view of a light emitting element according to an embodiment. The light emitting element includes a flexible plate-like portion 100. The plate-like portion 100 includes a glass substrate 110, and an organic functional layer which is formed on one surface side of the glass substrate 110. The organic functional layer includes a light emitting layer. The configuration of the organic functional layer will be described later in examples. When the plate-like portion 100 is curved in a prescribed curving direction, and thus one surface 102 of the plate-like portion 100 is a concave surface, and the other surface 101 thereof is a convex surface, a surface positioned on the concave surface side among both surfaces of the glass substrate 110 is referred to as a first surface 111. In addition, the thickness of the glass substrate 110 is T. When the plate-like portion 100 is curved in a prescribed curving direction, and thus the one surface 102 of the plate-like portion 100 is a concave surface, and the other surface 101 thereof is a convex surface, a compressive stress is applied to a portion (a compressive stress generation portion 112 in FIG. 1) whose distance from the first surface 111 of the glass substrate 110 is less than or equal to L (L>T/2).

Furthermore, as described later, for the sake of simple description, a positional relationship (an up and down relationship or the like) of each constituent of the light emitting element will be described by using a relationship illustrated in each drawing. However, the positional relationship in the description has no connection to a positional relationship at the time of using the light emitting element or at the time of manufacturing the light, emitting element.

In addition, in the following description, an operation in which the plate-like portion 100 is curved in a prescribed curving direction, and thus the one surface 102 of the plate-like portion 100 is a concave surface, and the other surface 101 thereof is a convex surface, is simply referred to as an operation of curving the plate-like portion 100.

The glass substrate 110 is formed of light transmissive glass. The glass substrate 110 is formed to have a thickness to the extent of having flexibility. It is preferable that the thickness of the glass substrate 110, for example, is approximately greater than or equal to 10 μm and less than or equal to 200 μm.

When the glass substrate 110 is formed to have a thickness of less than or equal to a certain degree of thickness, a certain degree of flexibility is able to be obtained. However, even when the glass substrate 110 is formed to be sufficiently thin, the glass substrate 110 cracks beginning at a trivial breakage point when the glass substrate 110 is bent at a large curvature exceeding the limitation (at a small curvature radius).

The present inventors have investigated a breakage (cracking) in the glass substrate 110, and thus have found that a crack predominantly progresses due to a tensile stress, and the glass substrate 110 is rarely broken by a compressive stress. Accordingly, breakage (cracking) in the glass substrate 110 is suppressed by predetermining a bending (curving) direction of the plate-like portion 100, and setting the arrangement of the glass substrate 110 in a thickness direction of the plate-like portion 100 such that a compressive stress is generated in a region with a thickness of greater than one-half of a thickness T of the glass substrate 110 in the thickness direction of the glass substrate 110 in a state where the plate-like portion 100 is curved.

When the plate-like portion 100 is curved, a tensile stress is generated in a portion of the convex surface side (the other surface 101 side) of the plate-like portion 100, and a compressive stress is generated in a portion of the concave surface side (the one surface 102 side). A center surface C1 illustrated in FIG. 1 is a surface keeping a balance between the tensile stress and the compressive stress in a state where the plate-like portion 100 is curved.

As described above, in a state where the plate-like portion 100 is curved, a surface which is the concave surface side of the plate-like portion 100 among the both surfaces of the glass substrate 110 is referred to as the first surface 111. In a state where the plate-like portion 100 is curved, a compressive stress is applied to the compressive stress generation portion 112 which is a portion whose distance from the first surface 111 of the glass substrate 110 is less than or equal to L. L is greater than one-half of the thickness T of the glass substrate. That is, L>T/2.

In other words, in the thickness direction of the glass substrate 110, a region with a thickness of greater than one-half of the thickness T of the glass substrate 110 is positioned on the other surface 101 side from the center surface C1. Accordingly, in a state where the plate-like portion 100 is curved, a compressive stress is generated in a region with a thickness of greater than one-half of the thickness T of the glass substrate 110, in the thickness direction of the glass substrate 110.

In addition, in the light emitting element according to this embodiment, a center C2 of the thickness direction of the glass substrate 110 (the center C2 of the glass substrate 110 in the thickness direction of the glass substrate 110) is positioned toward the one surface 102 side of the plate-like portion 100 than the center of the thickness direction of the plate-like portion 100 (the center of the plate-like portion 100 in the thickness direction of the plate-like portion 100: not illustrated). Furthermore, the center of the thickness direction of the plate-like portion 100 may be coincident with the center surface C1 described above, or may not be coincident with the center surface C1 described above.

The light emitting element according to this embodiment does not include a glass substrate (a glass substrate other than the glass substrate 110) at least toward the other surface 101 side than the glass substrate 110. It is preferable that the glass substrate included in the light emitting element is only the glass substrate 110.

As described above, according to this embodiment, the light emitting element is provided with the flexible plate-like portion 100 which includes the glass substrate 110, and the organic functional layer including the light emitting layer and formed on the one surface side of the glass substrate 110. When the plate-like portion 100 is curved in a prescribed curving direction, and thus the one surface 102 of the plate-like portion 100 is a concave surface, and the other surface 101 thereof is a convex surface, the surface positioned on the concave surface side among the both surfaces of the glass substrate 110 is referred to as the first surface 111. In addition, the thickness of the glass substrate 110 is T. When the plate-like portion 100 is curved, a compressive stress is applied to the portion whose distance from the first surface 111 of the glass substrate 110 is less than or equal to L (L>T/2). That is, the arrangement of the glass substrate 110 in the thickness direction of the light emitting element is set such that the compressive stress is applied to the compressive stress generation portion 112 which is the portion whose distance from the first surface 111 of the glass substrate 110 is less than or equal to L. Accordingly, it is possible to suppress a breakage (cracking) in the glass substrate 110, and thus it is possible to improve flexibility and reliability of the plate-like portion 100 of the light emitting element.

Here, as described above, Patent Documents 3 to 5 disclose a technology in which the inorganic moisture-proof layer or the like is arranged approximately in the center portion in the thickness direction of the light emitting element, and thus a stress generated in the inorganic moisture-proof layer or the like is reduced. For this reason, even when the light emitting element is bent in any direction, the same stress is generated in the inorganic moisture-proof layer or the like. The inorganic moisture-proof film is an extremely thin film having a thickness which is usually less than or equal to 1 µm, and thus it is possible to significantly reduce the stress generated in the inorganic moisture-proof film by the configuration as in Patent Documents 3 to 5. However, even a thin glass substrate 110, for example, has a thickness of greater than or equal to 10 µm, and thus when the center surface C1 is coincident with the center C2 of the thickness direction of the glass substrate 110, a tensile stress is generated in the glass substrate 110 when the plate-like portion 100 is bent, in any direction. A microcrack, a chipping of an end surface, or the like frequently occurs in the glass substrate 110, and the glass substrate 110 is weak to tensile stress compared to the inorganic moisture-proof film, and thus, in a configuration in which the glass substrate 110 is arranged in the same position as that of the inorganic moisture-proof layer or the like as in Patent Documents 3 to 5, it is difficult to obtain a practically sufficient curvature radius and breakage resistance.

In contrast, in this embodiment, the curving direction of the light emitting element is prescribed to one direction, and the arrangement of the glass substrate 110 in the thickness direction of the light emitting element is set such that the compressive stress is applied to the portion whose distance from the first surface 111 of the glass substrate 110 is less than or equal to L (L>T/2) at the time of bending the plate-like portion 100. Accordingly, it is possible to considerably reduce a tensile stress generated in the glass substrate 110. Alternatively, it is possible to obtain a state where only a compressive stress is generated in the glass substrate 110. As a result thereof, it is possible to bend the plate-like portion 100 at a smaller curvature radius, and it is possible to improve breakage resistance of the glass substrate 110.

Similarly, the center C2 of the thickness direction of the glass substrate 110 is positioned toward the one surface 102 side than the plate-like portion 100 from the center of the thickness direction of the plate-like portion 100, and thus a configuration is easily realized in which a compressive stress is applied to the compressive stress generation portion 112 which is the portion whose distance from the first surface 111 of the glass substrate 110 is less than or equal to L, and it is possible to suppress a breakage (cracking) in the glass substrate 110.

EXAMPLES

Example 1

A light emitting element according to this example is different from the light emitting element according to embodiment described above in the following description, and the other configuration is identical to that of the light emitting element according to embodiment described above.

Figure 2:
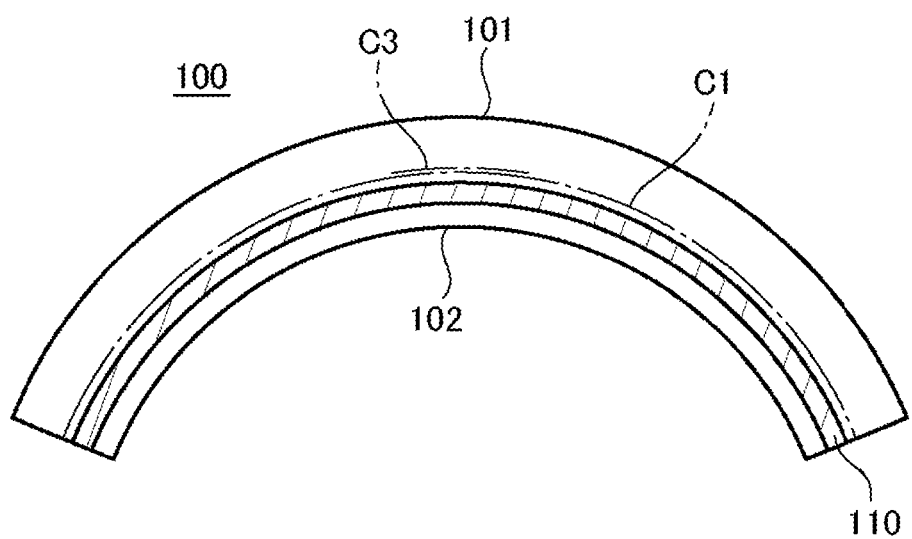
FIG. 2 is a schematic side cross-sectional view of a light emitting element according to Example 1.
Figure 3:
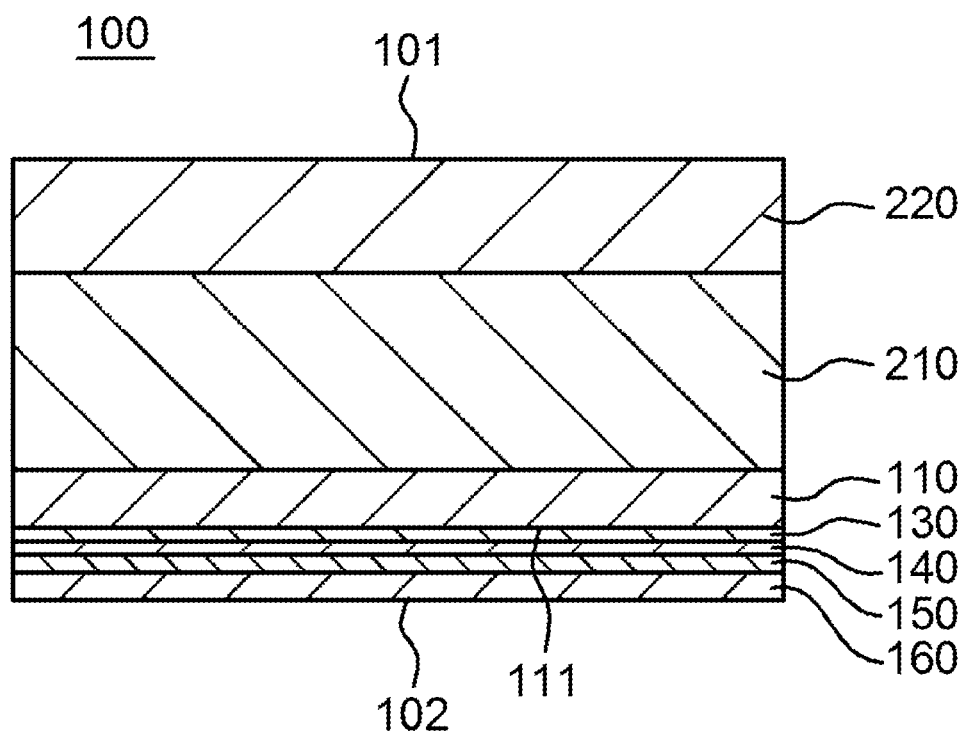
FIG. 3 is a schematic side cross-sectional view of the light emitting element according to Example 1.
Figure 4:
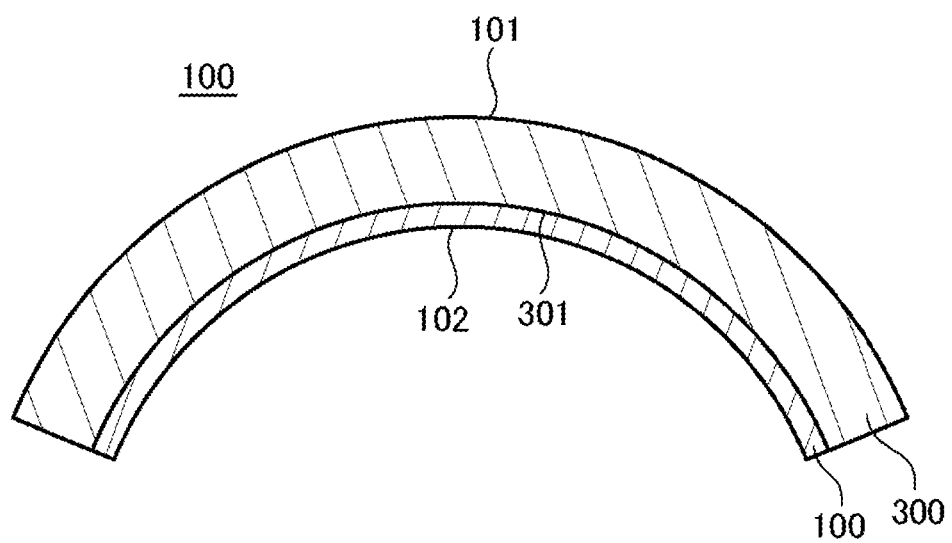
FIG. 4 is a schematic side cross-sectional view of the light emitting element according to Example 1.

Each drawing of FIG. 2 to FIG. 4 is a schematic side cross-sectional view of the light emitting element according to this example. Among them, FIG. 2 illustrates a schematic configuration of the plate-like portion 100. FIG. 3 illustrates a layer structure which is more specific than that in FIG. 2. FIG. 4 illustrates a state where the plate-like portion 100 is fixed to a fixation member 300.

In this example, an example will be described in which the light emitting element is a bottom emission type light emitting element, and emits light from the other surface 101 (the convex surface) side.

As illustrated in FIG. 2, in this example, the entire glass substrate 110 is positioned toward the one surface 102 side of the plate-like portion 100 than a center C3 of the thickness direction of the plate-like portion 100.

That is, the light emitting element according to this example is provided with the flexible plate-like portion 100 which includes the glass substrate 110, and an organic functional layer 140 (described later) including the light emitting layer and formed on the one surface side of the glass substrate 110, and the entire glass substrate 110 is positioned toward the one surface 102 side of the plate-like portion 100 than the center C3 of the thickness direction of the plate-like portion 100.

Accordingly, as illustrated in FIG. 2, in a state where the plate-like portion 100 is curved, it is possible to expect that a compressive stress is generated in the entire glass substrate 110.

Furthermore, it is preferable that the entire glass substrate 110 is positioned toward the one surface 102 side of the plate-like portion 100 than the center surface C1 (refer to FIG. 1). Thus, as illustrated in FIG. 2, in a state where the plate-like portion 100 is curved, it is possible to obtain a state where a compressive stress is generated in the entire glass substrate 110.

As illustrated in FIG. 3, the light emitting element includes the glass substrate 110, a first electrode 130, the organic functional layer 140, and a second electrode 150. The organic functional layer 140 is arranged between the first electrode 130 and the second electrode 150. The first electrode 130 is arranged between the organic functional layer 140 and the glass substrate 110.

The first electrode 130, for example, is a transparent electrode formed of a metal oxide conductor of Indium Tin Oxide (ITO), Indium Zinc Oxide (IZO), and the like. However, the first electrode 130 may be a thin metal film which is thin to the extent of transmitting light.

The second electrode 150, for example, is a reflective electrode formed of a metal layer of Ag, Au, Al, and the like. The second electrode 150 reflects light which is directed towards the second electrode 150 side from the organic functional layer 140. However, the second electrode 150 may be a transparent electrode formed of a metal oxide conductor of ITO, IZO, and the like, and a light reflective layer (not illustrated) may be disposed below the second electrode 150. Alternatively, the thickness of a metal layer configuring the second electrode 150 may be thin to have light transmissivity, and thus may function as a transparent light emitting element at the time of not emitting light.

Any one of the first electrode 130 and the second electrode 150 is an anode, and the other is a cathode. A work function of a material configuring the cathode is different from a work function of a material configuring the anode.

For example, one surface of the glass substrate 110 (a lower surface in FIG. 4) and one surface of the first electrode 130 (an upper surface in FIG. 1) are in contact with each other. In addition, the other surface of the first electrode 130 (a lower surface in FIG. 1) and one surface of the organic functional layer 140 (an upper surface in FIG. 1) are in contact with each other. In addition, the other surface of the organic functional layer 140 (a lower surface in FIG. 1) and one surface of the second electrode 150 (an upper surface in FIG. 1) are in contact with each other. However, another layer may be disposed between the glass substrate 110 and the first electrode 130. Similarly, another layer may be disposed between the first electrode 130 and the organic functional layer 140. Similarly, another layer may be disposed between the organic functional layer 140 and the second electrode 150.

The plate-like portion 100 further includes a resin layer 210 which is arranged toward the other surface 101 side of the plate-like portion 100 than the glass substrate 110. A layer thickness of the resin layer 210 is thicker than the thickness T of the glass substrate 110.

The resin layer 210, for example, is a light transmissive resin. The resin layer 210, for example, is formed of any one of polyethylene naphthalate (PEN), polyether sulfone (PES), polycarbonate (PC), polyethylene terephthalate (PET), polyimide, and polyamide.

Furthermore, the resin layer 210 may have an organic and inorganic hybrid structure. As the organic and inorganic hybrid structure, a structure configured by impregnating glass fiber cloth with a resin is included. In this case, the resin layer 210 (referred to as a resin-containing layer) has light transmissivity.

The resin layer 210, for example, is contact with a surface of the glass substrate 110 on a side opposite to the first surface 111. However, another layer may be disposed between the glass substrate 110 and the resin layer 210.

The plate-like portion 100 further includes a light extraction film 220 which is disposed on a side of the resin layer 210 opposite to the glass substrate 110 side. The light extraction film 220, for example, is formed of a microlens array sheet or a scattering sheet. The light extraction film 220, for example, is in contact with the side of the resin layer 210 opposite to the glass substrate 110 side. However, another layer may be disposed between the resin layer 210 and the light extraction film 220.

The organic functional layer 140 is arranged toward the other surface 101 side of the plate-like portion 100 than the glass substrate 110.

The plate-like portion 100 further includes a sealing layer 160. The sealing layer 160 covers the lower surface of the second electrode 150. The sealing layer 160, for example, is formed by sealing a layer formed of an inorganic solid (a SiON film, an $Al_2O_3$ film, and the like). The sealing layer 160, for example, may be formed by Chemical Vapor Deposition (CVD) or Atomic Layer Deposition (ALD). Furthermore, a protective film formed of an organic material may be formed below an inorganic solid layer. Further, solid sealing (for example, attaching an aluminum foil by a thermosetting epoxy adhesive agent, or the like) may be performed.

As illustrated in FIG. 4, the light emitting element according to this example further includes the fixation member 300 including a curved surface (for example, a concave surface 301). The plate-like portion 100 is fixed to the fixation member 300 along a concave curve of the fixation member 300, and is curved such that the one surface 102 of the plate-like portion 100 is a concave surface, and the other surface 101 thereof is a convex surface.

In this example, the fixation member 300 has light transmissivity. The fixation member 300, for example, is formed of a transparent acrylic plate.

Furthermore, a surface of the fixation member 300 on a side opposite to the concave surface 301 (an upper surface in FIG. 4), for example, is a convex surface. However, the surface of the fixation member 300 on the side opposite to the concave surface 301 may be a flat surface, or may be a surface having another shape.

A voltage is applied between the first electrode 130 and the second electrode 150, and thus the light emitting layer of the organic functional layer 140 emits light. All of the organic functional layer 140, the first electrode 130, the glass substrate 110, the resin layer 210 and the light extraction film 220, and the fixation member 300 transmit at least a part of the light emitted by the light emitting layer of the organic functional layer 140. A part of the light emitted by the light emitting layer is emitted to the outside of the light emitting element from the upper surface of the fixation member 300.

Next, an example of a layer structure of the organic functional layer 140 will be described.

Figure 5:
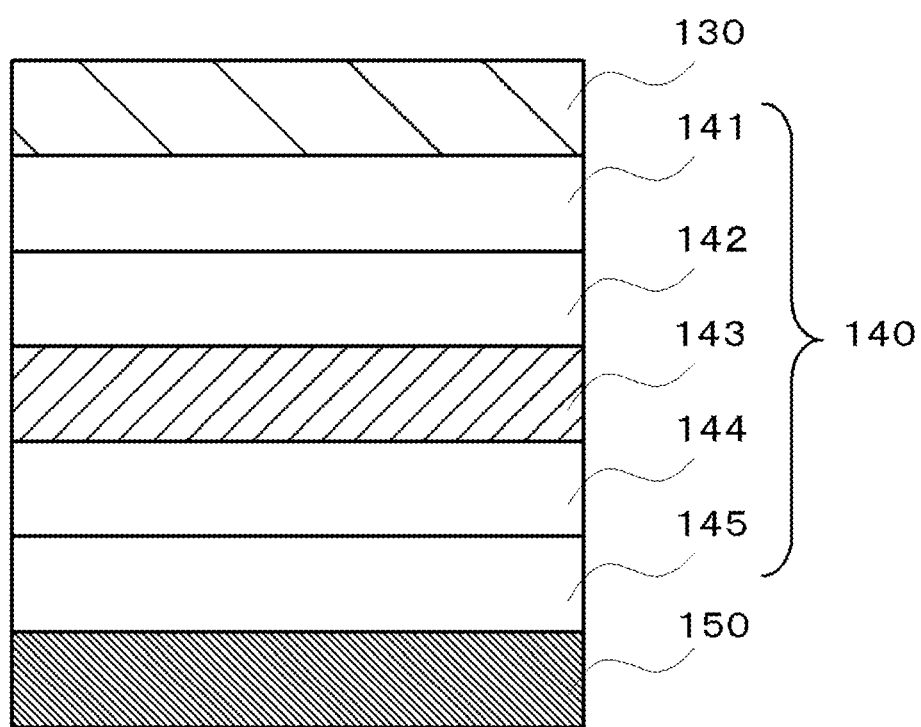
FIG. 5 is a side cross-sectional view illustrating a first example of a layer structure of an organic functional layer.

FIG. 5 is a side cross-sectional view illustrating a first example of the layer structure of the organic functional layer 140. The organic functional layer 140 has a structure in which a hole injection layer 141, a hole transport layer 142, a light emitting layer 143, an electron transport layer 144, and an electron injection layer 145 are laminated in this order. That is, the organic functional layer 140 is an organic electroluminescent light emitting layer. Furthermore, instead of the hole injection layer 141 and the hole transport layer 142, one layer which functions as these two layers may be disposed. Similarly, instead of the electron transport layer 144 and the electron injection layer 145, one layer which functions as these two layers may be disposed.

In this example, the light emitting layer 143, for example, is a layer emitting red light, a layer emitting blue light, or a layer emitting green light. In this case, in a plan view, a region including the light, emitting layer 143 which emits red light, a region including the light emitting layer 143 which emits green light, and a region including the light, emitting layer 143 which emits blue light may be repeatedly disposed. In this case, when the respective regions simultaneously emit light, the light emitting element emits light having a single color such as a white color.

Furthermore, the light emitting layer 143 may be configured to emit light having a single color such as a white color by mixing materials for emitting light having a plurality of colors.

Figure 6:
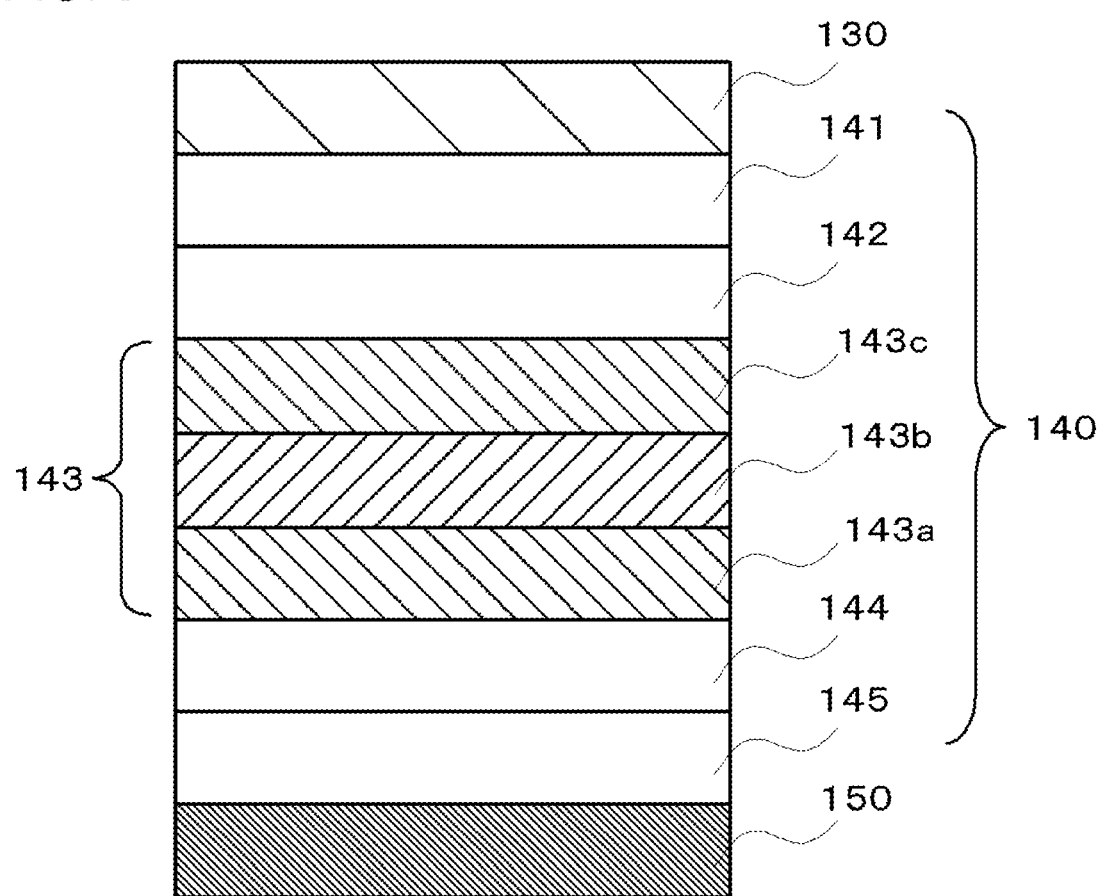
FIG. 6 is a side cross-sectional view illustrating a second example of the layer structure of the organic functional layer.

FIG. 6 is a side cross-sectional view illustrating a second example of the layer structure of the organic functional layer 140. The light emitting layer 143 of the organic functional layer 140 has a configuration in which light emitting layers 143a, 143b, and 143c are laminated in this order. The light emitting layers 143a, 143b, and 143c emit light having colors different from each other (for example, red, green, and blue). Then, when the light emitting layers 143a, 143b, and 143c simultaneously emit light, the light emitting element emits light having a single color such as a white color.

Next, an example of a manufacturing method of the light emitting element according to this embodiment will be described.

First, a light transmissive conductive film formed of a metal oxide conductor of ITO, IZO, and the like is formed on the lower surface of the glass substrate 110 (the first surface 111) by a sputtering method or the like, and the light transmissive conductive film is patterned by etching, and thus the first electrode 130 is formed.

Next, an organic material is formed into a film on the lower surface of the first electrode 130, and thus the organic functional layer 140 is formed.

Next, a metal material such as Ag, Au, and Al is deposited in a desired pattern on the lower surface of the organic functional layer 140 by a vapor deposition method or the like, and thus the second electrode 150 is formed.

Next, the sealing layer 150 is formed on the lower surface of the second electrode 150.

Furthermore, as necessary, each of a bus line and a partition wall portion may be formed at a suitable timing. The bus line is configured of a material having resistance lower than that of the first electrode 130, and is disposed to be in contact with the first electrode 130. The partition wall portion partitions the organic functional layer 140 into a plurality of regions in a plan view and is configured of an insulating film.

According to this example, the same effect as that in the embodiment described above is able to be obtained, and the following effect is able to be obtained.

The entire glass substrate 110 is positioned toward the one surface 102 side of the plate-like portion 100 than the center C3 of the thickness direction of the plate-like portion 100, and thus, in a state where the plate-like portion 100 is curved, it is possible to expect that a compressive stress is generated in the entire glass substrate 110. Accordingly, it is possible to further suppress a breakage in the glass substrate 110.

The plate-like portion 100 further includes the resin layer 210 which is arranged toward the other surface 101 side of the plate-like portion 100 than the glass substrate 110, and a layer thickness of the resin layer 210 is thicker than the thickness T of the glass substrate 110. Accordingly, it is possible to easily realize a configuration in which the entire glass substrate 110 is positioned toward the one surface 102 side than the center C3 of the thickness direction of the plate-like portion 100.

The light emitting element further includes the fixation member 300 including the curved surface (for example, the concave surface 301), and the plate-like portion 100 is fixed to the fixation member 300 along the curved surface of the fixation member 300 and is bent such that the one surface 102 of the plate-like portion 100 is a concave surface, and the other surface 101 thereof is a convex surface. Accordingly, it is possible to constantly maintain the curving direction of the plate-like portion 100. Furthermore, the curving direction of the plate-like portion 100 is a direction in which a breakage in the glass substrate 110 is suppressed.

In addition, the curved surface of the fixation member 300 is the concave surface 301, and thus the plate-like portion 100 is pressed to the concave surface 301 of the fixation member 300 by an elastic force of the plate-like portion 100 trying to restore its flat shape. Accordingly, even when the plate-like portion 100 is not firmly fixed to the fixation member 300, the plate-like portion 100 easily maintains a state of being attached to the fixation member 300. In addition, a surface (a light emitting surface) on the light extraction film 220 side which is exposed to a user side is covered with the fixation member 300, and thus the light emitting element is able to have a structure which is resistant to impact from the outside.

Furthermore, in Example 1 described above, an example is described in which the fixation member 300 is arranged only in the other surface 101 side of the plate-like portion 100. However, the plate-like portion 100 may be fixed by being interposed between a concave surface of a first fixation member including a concave surface and a convex surface of a second fixation member including a convex surface. In this case, the both surfaces of the plate-like portion 100 are able to be protected by the first fixation member and the second fixation member, respectively.

Example 2

A configuration of the plate-like portion 100 of the light emitting element according to this example is identical to that in Example 1 described above. In this example, a specific structure of the plate-like portion 100 will be described with reference to a distribution model of a stress in the glass substrate 110.

Figure 7:
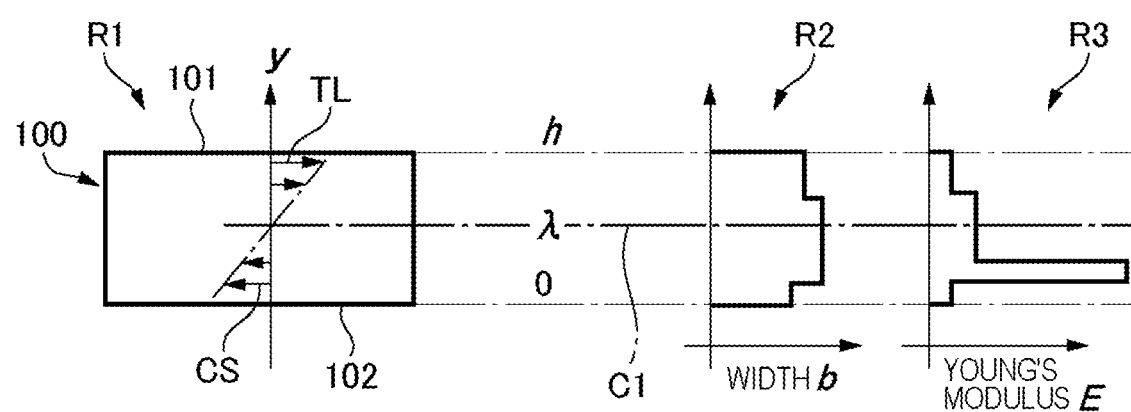
FIG. 7 is a diagram for illustrating a stress generated in a plate-like portion when the plate-like portion is bent.

FIG. 7 is a diagram for illustrating a stress generated in the plate-like portion 100 at the time of bending the plate-like portion 100. In FIG. 7, a distribution of the stress in the plate-like portion 100 is illustrated in a region R1, a width (a width b) in a direction orthogonal to the thickness direction of each layer in the plate-like portion 100 is illustrated in a region R2, and Young's modulus (longitudinal elastic modulus) E of each layer in the plate-like portion 100 is illustrated in a region R3. In each of the regions R1 to R3, a vertical axis is a thickness direction position y. A horizontal axis of the region R1 is the size of the stress, a horizontal axis of the region R2 is the width b, and a horizontal axis of the region R3 is the Young's modulus E.

Here, the center surface C1 illustrated in FIG. 2 is a surface keeping a balance between a tensile stress and a compressive stress in a state where the plate-like portion 100 is curved.

The width b and the Young's modulus E are functions of the position y in the thickness direction of the light emitting element, and when the light emitting element is in a position of y=0 to y=h (that is, when the thickness of the light emitting element is h), a position λ of the center surface C1 in the thickness direction of the light emitting element is able to be calculated by Expression 1 described below.

[Expression 1]

$$\lambda = \frac{\int_0^h b(y) \cdot E(y) \cdot y \cdot dy}{\int_0^h b(y) \cdot E(y) \cdot dy} \quad \text{(Expression 1)}$$

The width b of the organic functional layer 140 and the sealing layer 160 is slightly less than the width b of the glass substrate 110 which is nearly negligible, and thus the width b is able to be constant in an actual light emitting element.

In a state where the plate-like portion 100 is bent at a constant curvature, a stress σ generated in the plate-like portion 100 is able to be calculated by Expression 2 described below. In Expression 2, ρ is a curvature radius of the plate-like portion 100.

[Expression 2]

$$\sigma = \frac{E(y - \lambda)}{\rho} \quad \text{(Expression 2)}$$

As in Expression 2 described above, the stress σ is proportionate to the distance from the center surface C1 and the Young's modulus, and is inversely proportionate to the curvature radius ρ.

Here, as illustrated in the region R1 of FIG. 7, a tensile stress TL is generated toward the convex surface side than on the center surface C1 in the plate-like portion 100, and a compressive stress CS is generated on the concave surface side.

The position λ of the center surface C1 when the light emitting element is configured of three layers is able to be calculated by Expression 3 described below.

[Expression 3]

$$\lambda = \frac{\begin{array}{c}E_1 t_1^2/2 + E_2(t_2^2/2 + t_1 t_2) + \\ E_3[t_3^2/2 + t_3(t_1 + t_2)] + \\ E_4[t_4^2/2 + t_4(t_1 + t_2 + t_3)]\end{array}}{E_1 t_1 + E_2 t_2 + E_3 t_3 + E_4 t_4} \quad \text{(Expression 3)}$$

Here, an example of the thickness of each layer in the plate-like portion 100 is as follows.

Thickness $t_1$ of a portion including the first electrode 130, the organic functional layer 140, the second electrode 150, and the sealing layer 160=5 μm Thickness $t_2$ of the glass substrate 110=50 μm Thickness $t_3$ of the resin layer 210=200 μm Thickness $t_4$ of the light extraction film 220=100 μm In addition, an example of the Young's modulus of each layer in the plate-like portion 100 is as follows.

Young's modulus $E_1$ of the portion including the first electrode 130, the organic functional layer 140, the second electrode 150, and the sealing layer 160=3 GPa Young's modulus $E_2$ of the glass substrate 110=70 GPa Young's modulus $E_3$ of the resin layer 210=6 GPa Young's modulus $E_4$ of the light extraction film 220=3 GPa Furthermore, the resin layer 210 is a substrate formed of PEN. The first electrode 130 is formed of ITO. The sealing layer 160 includes a CVD film of SiON, and a protective film formed of an ultraviolet curable resin.

In such conditions, the position A of the center surface C1 is 76 μm according to Expression (3) described above. In addition, the position of the center C2 (refer to FIG. 1) of the thickness direction of the glass substrate 110 is 46 μm, and the center C2 is arranged on a position which is shifted to the other surface 101 (the concave surface) side from the position A of the center surface C1. In addition, the upper surface of the glass substrate 110 is also arranged on a position which is shifted to the other surface 101 (the concave surface) side from the position A of the center surface C1 by 21 μm. That is, in a state where the plate-like portion 100 is curved, the entire glass substrate 110 receives a compressive stress.

Here, as it is known from the consideration of the present inventors, a breakage (cracking) in the glass substrate 110 predominantly progresses due to a tensile stress, and the glass substrate 110 is rarely broken by a compressive stress.

When the plate-like portion 100 of the light emitting element of this example was curved in a direction (a direction in which the sealing layer 160 side is a convex surface) opposite to that of FIG. 2, a crack occurred in the glass substrate 110 at the stage of φ80 mm (a curvature radius of 40 mm). In contrast, when the plate-like portion 100 of the light emitting element of this example is curved in the direction of FIG. 2, that is, a prescribed curving direction, no occurrence of cracking in the glass substrate 110 was confirmed even at φ10 mm (a curvature radius of 5 mm).

Thus, by limiting the bending direction of the plate-like portion 100 to one direction, and arranging the glass substrate 110 to be shifted toward the other surface 101 (the concave surface) side from the center surface C1, a portion of greater than or equal to one-half of the glass substrate 110 is able to receive a compressive stress. As a result thereof, even when the plate-like portion 100 is bent at a high curvature, it is possible to suppress a breakage in the glass substrate 110.

According to this example, the same effect as that of Example 1 described above is able to be obtained.

Furthermore, when the light emitting surface side is bent to be convex as in this example and Example 1 described above, it is necessary that the center surface C1 is closer to the light emitting surface side than the glass substrate 110. For this reason, a structure is formed in which the resin layer 210 having a comparatively high Young's modulus is arranged toward the light emitting surface side than the glass substrate 110, and one light extraction film 220 having a certain degree of thickness is disposed. In addition, as the sealing layer 160, a sealing film having a small thickness is used.

In addition, in this example, an example is described in which the entire glass substrate 110 is arranged in the position which is shifted to the concave surface side from the center surface C1, and the entire glass substrate 110 receives a compressive stress. However, it is possible to expect a certain degree of effect insofar as the center C2 of the thickness direction of the glass substrate 110 (refer to FIG. 1) is shifted to the concave surface side from the center surface C1. For example, in an example where the resin layer 210 (t2=100 μm, E2=6 GPa) is laminated on the glass substrate 110 (t1=50 μm, E1=70 GPa), the center surface is λ=36 μm and is positioned in the glass substrate 110. In such conditions, when the plate-like portion 100 was curved in the direction of FIG. 2, the plate-like portion 100 was able to be bent without being broken to a curvature of ⅓, compared to a case where the plate-like portion 100 was curved in the direction opposite to that of FIG. 2. The reason for this may be that, although a tensile stress is applied on the convex surface side of the glass substrate 110 when the plate-like portion 100 is curved in any direction, as shown in Expression 2, the stress decreases as the distance from the center surface C1 becomes shorter. Thus, compared to when the plate-like portion 100 is curved in the direction opposite to that shown in FIG. 2, the tensile stress is further decreased when the plate-like portion 100 is curved in the direction shown in FIG. 2, at the same curvature of the plate-like portion 100.

Example 3

Figure 8:
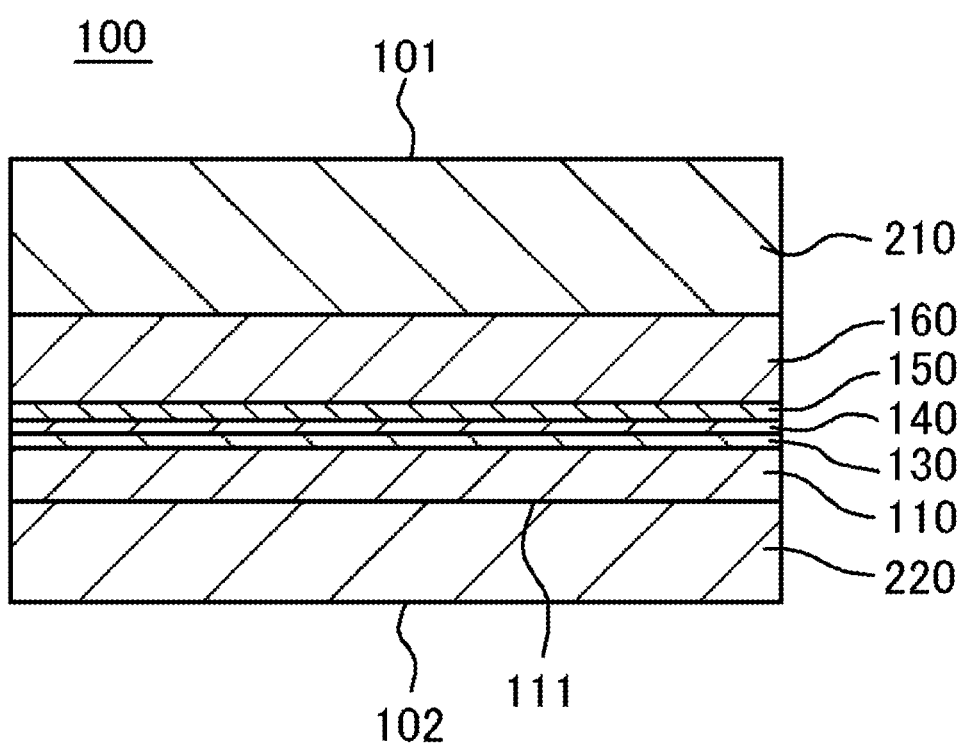
FIG. 8 is a schematic side cross-sectional view of a light emitting element according to Example 3.

FIG. 8 is a schematic side cross-sectional view of a light emitting element according to Example 3. In Examples 1 and 2 described above (FIG. 3), an example is described in which the light emitting element is a bottom emission type light emitting element, and emits light from the other surface 101 (the convex surface) side. On the other hand, in this example, an example will be described in which the light emitting element is a bottom emission type light emitting element, and emits light from the one surface 102 (the concave surface) side.

In Examples 1 and 2 described above, the glass substrate 110, the first electrode 130, the organic functional layer 140, the second electrode 150, and the sealing layer 160 are arranged on the one surface 102 side on the basis of the resin layer 210 in this order. In contrast, in this example, the sealing layer 160, the second electrode 150, the organic functional layer 140, the first electrode 130, the glass substrate 110, and the light extraction film 220 are arranged on the one surface 102 side on the basis of the resin layer 210 in this order. In addition, an upper surface of the resin layer 210 is the other surface 101, and a lower surface of the light extraction film 220 is the one surface 102.

However, a point that, a compressive stress is applied to the portion whose distance from the first, surface 111 of the glass substrate 110 is less than or equal to L (L>T/2) at the time of curving the plate-like portion 100 is identical to that of Examples 1 and 2 described above. In addition, the arrangement of the glass substrate 110 with respect to the center surface C1 and the arrangement of the glass substrate 110 with respect to the center C3 of the thickness direction of the plate-like portion 100 are identical to those of Examples 1 and 2 described above. In addition, the light emitting element may also include the fixation member 300 described above.

Furthermore, in this example, it is not necessary that resin layer 210 has light transmissivity.

By applying a voltage between the first electrode 130 and the second electrode 150, the light emitting layer of the organic functional layer 140 emits light. The light from the light emitting layer is transmitted through the first electrode 130, the glass substrate 110, and the light extraction film 220 in this order, and is emitted to the outside of the light emitting element from the lower surface of the light extraction film 220.

According to this example, the same effect as that of Examples 1 and 2 described above is able to be obtained.

Furthermore, in this example, it is preferable that the light extraction film 220 is formed as thinly as possible. Alternatively, it is preferable to omit the light extraction film 220. In addition, it is preferable that a sealing solid having a thickness greater than that of a sealing film is used as the sealing layer 160.

Example 4

Figure 9:
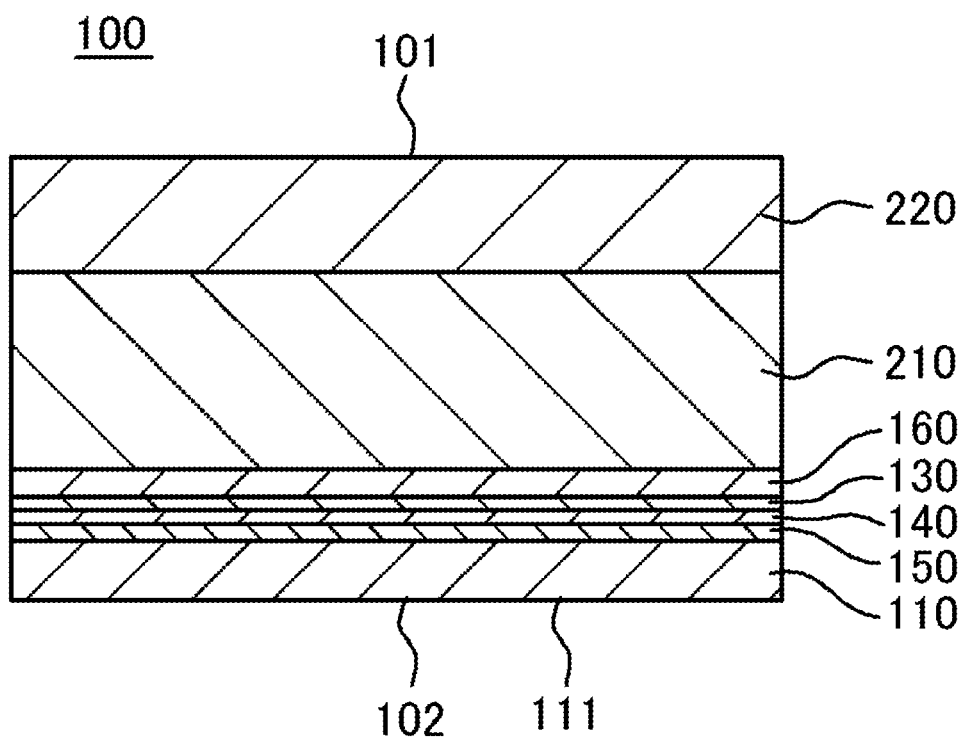
FIG. 9 is a schematic side cross-sectional view of a light emitting element according to Example 4.

FIG. 9 is a schematic side cross-sectional view of a light emitting element according to Example 4. In Examples 1 and 2 described above (FIG. 3), an example is described in which the light, emitting element is a bottom emission type light emitting element. On the other hand, in this example, an example will be described in which the light emitting element is a top emission type light emitting element. In addition, in this example, an example will be described in which light is emitted from the other surface 101 (the convex surface) side.

In Examples 1 and 2 described above, the glass substrate 110, the first electrode 130, the organic functional layer 140, the second electrode 150, and the sealing layer 160 are arranged on the one surface 102 side on the basis of the resin layer 210 in this order. In contrast, in this example, the sealing layer 160, the first electrode 130, the organic functional layer 140, the second electrode 150, and the glass substrate 110 are arranged on the one surface 102 side on the basis of the resin layer 210 in this order. In addition, the upper surface of the resin layer 210 is the other surface 101, and the lower surface of the glass substrate 110 is the one surface 102.

However, a point that a compressive stress is applied to the portion whose distance from the first surface 111 of the glass substrate 110 is less than or equal to L (L>T/2) at the time of curving the plate-like portion 100 is identical to that, of Examples 1 and 2 described above. In addition, the arrangement of the glass substrate 110 with respect to the center surface C1 and the arrangement of the glass substrate 110 with respect to the center C3 of the thickness direction of the plate-like portion 100 are identical to those of Examples 1 and 2 described above. In addition, the light emitting element may also include the fixation member 300 described above.

Furthermore, the sealing layer 160 has light transmissivity.

By applying a voltage between the first electrode 130 and the second electrode 150, the light emitting layer of the organic functional layer 140 emits light. The light from the light emitting layer is transmitted through the first electrode 130, the sealing layer 160, the resin layer 210, and the light extraction film 220 in this order, and is emitted to the outside of the light emitting element from the upper surface of the light extraction film 220.

According to this example, the same effect as that of Examples 1 and 2 described above is able to be obtained.

Example 5

Figure 10:
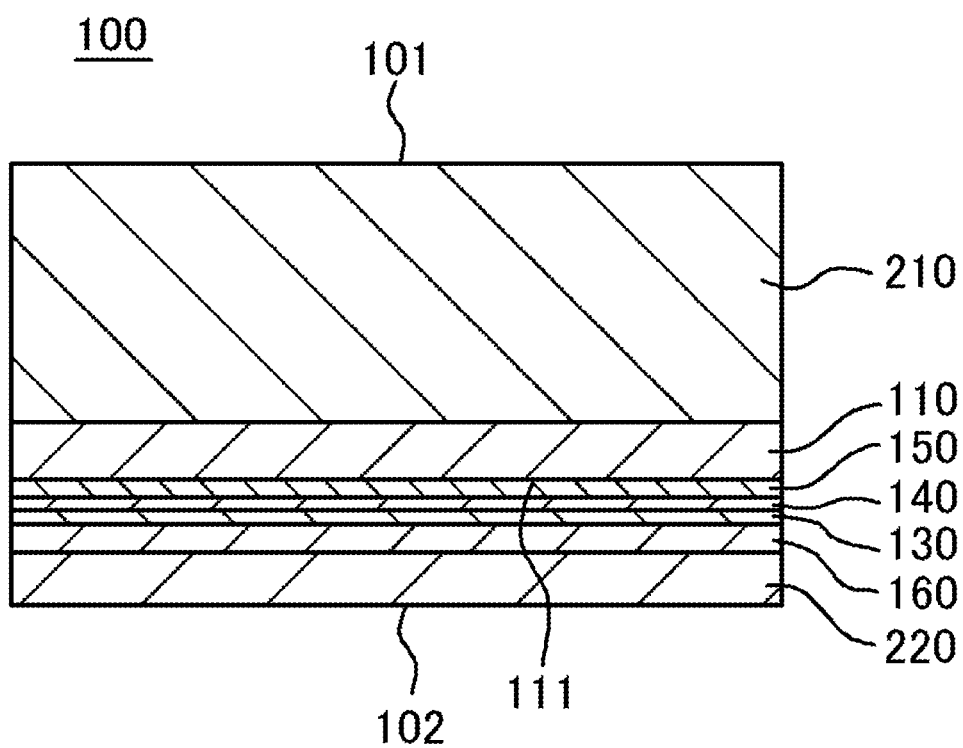
FIG. 10 is a schematic side cross-sectional view of a light emitting element according to Example 5.

FIG. 10 is a schematic side cross-sectional view of a light emitting element according to Example 5. In Examples 1 and 2 described above (FIG. 3), an example is described in which the light emitting element is a bottom emission type light emitting element. On the other hand, in this example, an example will be described in which the light emitting element is a top emission type light emitting element. In addition, in this example, an example will be described in which light is emitted from the other surface 101 (the concave surface) side.

In Examples 1 and 2 described above, the glass substrate 110, the first electrode 130, the organic functional layer 140, the second electrode 150, and the sealing layer 160 are arranged on the one surface 102 side on the basis of the resin layer 210 in this order. In contrast, in this example, the glass substrate 110, the second electrode 150, the organic functional layer 140, the first electrode 130, the sealing layer 160, and the light extraction film 220 are arranged on the one surface 102 side on the basis of the resin layer 210 in this order. In addition, the upper surface of the resin layer 210 is the other surface 101, and the lower surface of the light extraction film 220 is the one surface 102.

However, a point, that a compressive stress is applied to the portion whose distance from the first surface 111 of the glass substrate 110 is less than or equal to L (L>T/2) at the time of bending the plate-like portion 100 is identical to that of Examples 1 and 2 described above. In addition, the arrangement of the glass substrate 110 with respect to the center surface C1 and the arrangement of the glass substrate 110 with respect to the center C3 of the thickness direction of the plate-like portion 100 are identical to those of Examples 1 and 2 described above. In addition, the light emitting element may also include the fixation member 300 described above.

Furthermore, in this example, it is not necessary that the resin layer 210 has light transmissivity. In contrast, the sealing layer 160 has light transmissivity.

By applying a voltage between the first electrode 130 and the second electrode 150, the light emitting layer of the organic functional layer 140 emits light. The light from the light emitting layer is transmitted through the first electrode 130, the sealing layer 160, and the light extraction film 220 in this order, and is emitted to the outside of the light emitting element from the lower surface of the light extraction film 220.

According to this example, the same effect as that of Examples 1 and 2 described above is able to be obtained.

Furthermore, in this example, it is preferable that the light extraction film 220 is formed as thinly as possible. Alternatively, it is preferable to omit the light extraction film 220. In addition, it is preferable that a sealing solid having a thickness greater than that of a sealing film is used as the sealing layer 160.

Example 6

Figure 11:
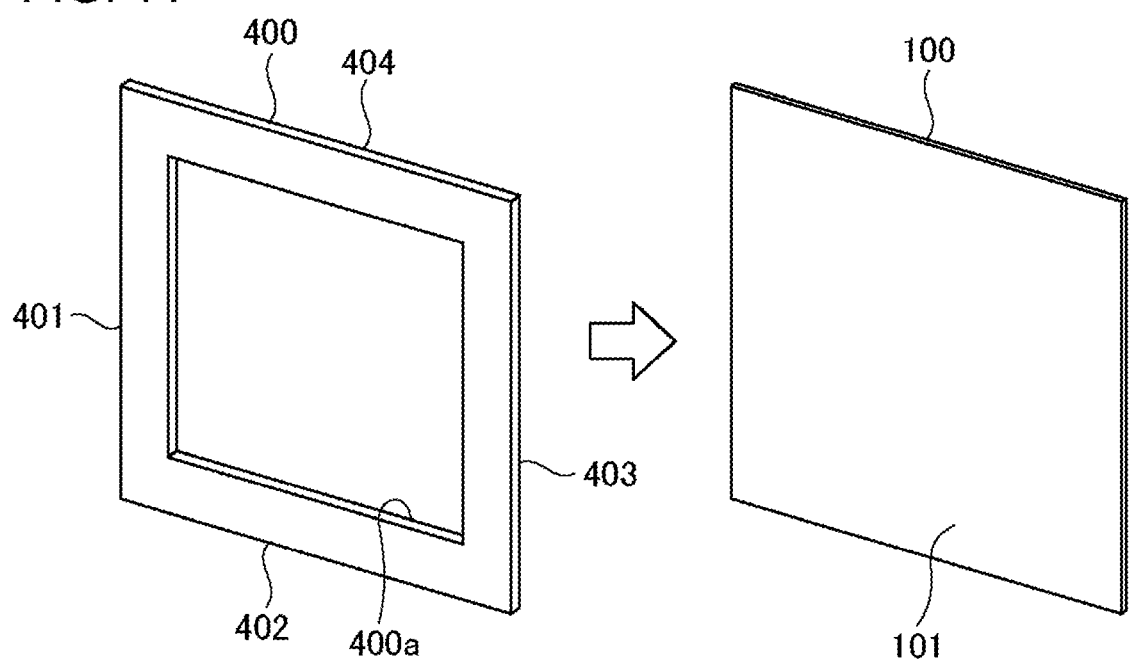
FIG. 11 is a schematic exploded perspective view of a light emitting element according to Example 6.
Figure 12:
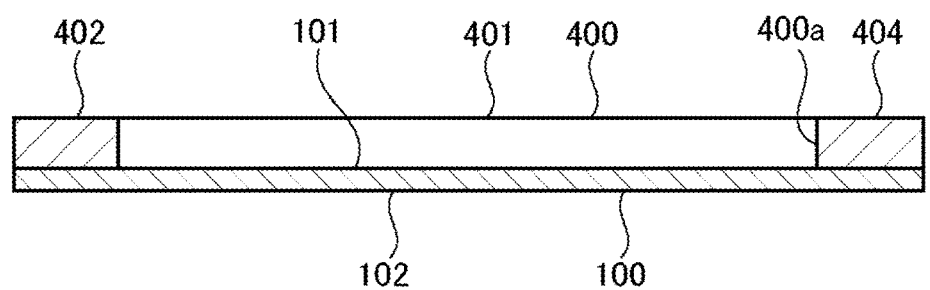
FIG. 12($a$) is a schematic cross-sectional view of the light emitting element according to Example 6 (when the light emitting element is not bent), FIG. 12($b$) is a schematic cross-sectional view of the light emitting element according to Example 6 (when the light emitting element is bent), and FIG. 12($c$) is a schematic side cross-sectional view of the light emitting element according to Example 6.
Figure 12:
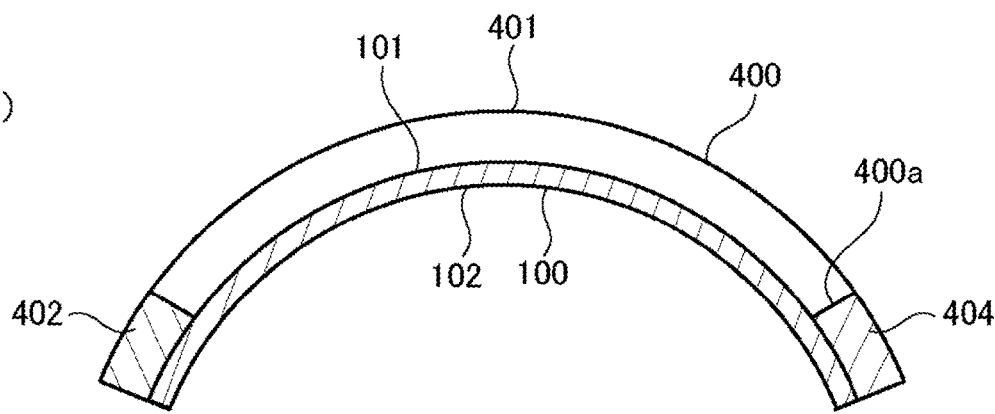
Figure 12:
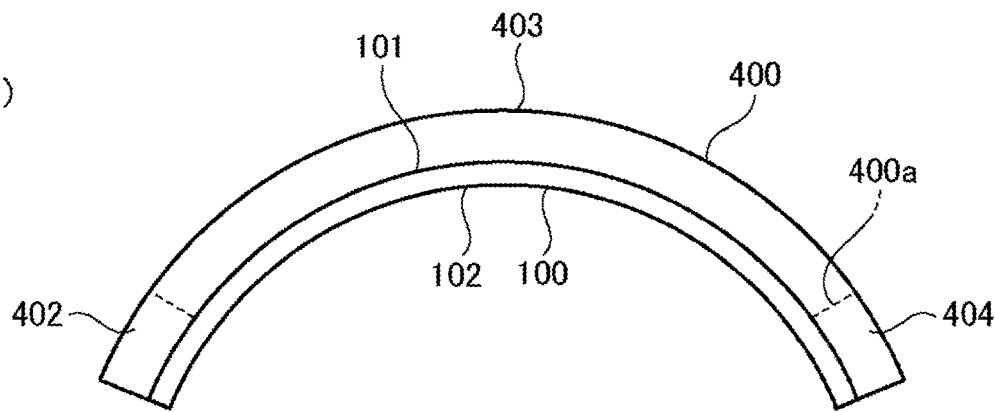

FIG. 11 is a schematic exploded perspective view of a light emitting element according to Example 6. FIG. 12(a) is a schematic cross-sectional view of the light emitting element according to Example 6 (when the light emitting element is not curved), FIG. 12(b) is a schematic cross-sectional view of the light emitting element according to Example 6 (when the light emitting element is curved), and FIG. 12(c) is a schematic side cross-sectional view of the light emitting element according to Example 6. The light emitting element according to this example is different from the light emitting element according to Example 1 described above in the following description, and the other configuration is identical to that of the light emitting element according to Example 1 described above.

The plate-like portion 100 of the light emitting element according to this example has the same configuration as that of the plate-like portion 100 according to any one of Examples 1 to 5 described above.

The light emitting element according to this example includes a fixation member 400 instead of the fixation member 300 described above (FIG. 4). The fixation member 400 is able to be subjected to plastic deformation, and is fixed to the other surface 101 side of the plate-like portion 100 (FIG. 12(a)). Then, the plate-like portion 100 is curved along with the fixation member 400, and thus the other surface 101 of the plate-like portion 100 is a convex surface, and the other surface 101 thereof is a concave surface, and thus the plate-like portion 100 is maintained in a curved state by the fixation member 400 (FIG. 12(b) and FIG. 12(c)).

That is, the fixation member 400 is subjected to the plastic deformation, and thus the fixation member 400 is maintained in the shape after the plastic deformation. In addition, the flexible plate-like portion 100 is restrained by the fixation member 400, and thus the plate-like portion 100 is maintained in a bent state by the fixation member 400.

Thus, in this example, the fixation member 400 is curved along with the plate-like portion 100, and thus the fixation member 400 is subjected to the plastic deformation into the shape which includes a curved surface.

More specifically, for example, the plate-like portion 100 is in the shape of a rectangle. On the other hand, the fixation member 400 is formed in the shape of a rectangular frame of the plate-like portion 100.

The fixation member 400 includes four linear plate-like portions 401 to 404 which extend along each side of the plate-like portion 100. Among them, the plate-like portion 401 and the plate-like portion 403 face each other and are in parallel, and the plate-like portion 402 and the plate-like portion 404 face each other and are in parallel. In addition, the plate-like portions 402 and 403 are orthogonal to the plate-like portions 401 and 403. A rectangular opening portion 400a is formed in center portion of the fixation member 400.

For example, as illustrated in FIGS. 12(b) and 12(c), the plate-like portions 401 and 403 are curved into the shape of an arc, and the plate-like portion 100 is curved, and thus the plate-like portions 401 and 403 are subjected to the plastic deformation, and the plate-like portion 100 is maintained in a curved state.

That, is, the fixation member 400 includes a first portion (the plate-like portion 401) which extends along a first side of the plate-like portion 100, and a second portion (the plate-like portion 402) which extends along a second side facing the first side of the plate-like portion 100. Then, each of the first portion and the second portion is curved into the shape of an arc.

In a case where light is emitted from the other surface 101 side of the plate-like portion 100 (in the plate-like portion 100 according to Example 1, 2, or 4 described above), it is possible to preferably emit the light through the opening portion 400a of the fixation member 400.

In addition, when the plate-like portion 100 has the configuration according to any one of Examples 1 to 5 described above, it is possible to preferably release heat through the opening portion 400a of the fixation member 400.

The fixation member 400, for example, is able to be configured of metal. A method of fixing the plate-like portion 100 to the fixation member 400 is not limited, and for example, the plate-like portion 100 is able to be fixed to the fixation member 400 by using an adhesive agent.

According to this example, the same effect (excluding the effect which is able to be obtained by the fixation member 300) as that of Example 1 described above is able to be obtained, and the following effect is able to be obtained.

The fixation member 400 is curved along with the plate-like portion 100, and thus the fixation member 400 is subjected to the plastic deformation into the shape including the curved surface. Accordingly, the plate-like portion 100 is maintained in a curved state in which the one surface 102 of the plate-like portion 100 is a concave surface, and the other surface 101 thereof is a convex surface, by the fixation member 400. That is, the curving direction of the plate-like portion 100 is able to be constantly maintained by the fixation member 400. Furthermore, the bending direction of the plate-like portion 100 is a direction in which a breakage in the glass substrate 110 is suppressed.

In addition, in this example, the entire light emitting element composed of the fixation member 400 and the plate-like portion 100 joined together is curved, and thus the same effect as that of moving the center surface C1 described above to the fixation member 400 side (an upper side in FIGS. 12(b) and 12(c)) is able to be obtained, compared to Example 1. As a result thereof, it is possible to increase a compressive stress generated in the glass substrate 110 in a state where the plate-like portion 100 is curved. In other words, in Example 1, the same effect as that of increasing the layer thickness of the resin layer 210 is able to be obtained.

Here, as the Young's modulus of a material arranged on the convex surface side of the light emitting element becomes higher, the effect of moving the center surface C1 to the convex surface side of the light emitting element is obtained. As shown in Expression 1 described above, even when the thickness (the width b) of the fixation member 400 decreases, the effect is able to be sufficiently obtained insofar as Young's modulus of the fixation member 400 is high.

In addition, the plate-like portion 100 is in the shape of a rectangle, and the fixation member 400 includes the first portion (the plate-like portion 401) which extends along the first side of the plate-like portion 100 and the second portion (the plate-like portion 402) which extends along the second side facing the first side of the plate-like portion 100. Then, each of the first portion and the second portion is curved into the shape of an arc. Therefore, the plate-like portion 100 is maintained in a curved state in which the one surface 102 of the plate-like portion 100 is a concave surface, and the other surface 101 thereof is a convex surface, by the fixation member 400.

As described above, the embodiments and the examples are described with reference to the drawings, the embodiments and the examples are exemplifications of the present invention, and various configurations other than the configurations described above are able to be adopted.

For example, in the above description, an example is described in which an external force is applied to the plate-like portion 100, and the plate-like portion 100 is curved, and thus a compressive stress is generated in the glass substrate 110. A compressive stress may also be generated in the glass substrate 110 by performing a chemical treatment with respect to the glass substrate 110.

The invention claimed is:

1. A light emitting element comprising:
a flexible plate-like portion; and
a fixation member fixing the flexible plate-like portion,
wherein the flexible plate-like portion comprises:
  a glass substrate;
  an organic functional layer comprising a light emitting layer, the organic functional layer being formed on one surface side of the glass substrate; and
  a resin layer having, a thickness greater than that of the glass substrate,
wherein the fixation member fixes the flexible plate-like portion such that a surface side at which the resin layer is formed relative to the glass substrate is a convex surface,
wherein a center of a thickness direction of the glass substrate is closer to a concave surface than a center of a thickness direction of the flexible plate-like portion is, and
wherein a center of the thickness direction of the light emitting element is positioned in the resin layer.

2. The light emitting element according to claim 1, wherein a compressive stress is applied to a region with a thickness of greater than one-half of the thickness direction of the glass substrate.

3. The light emitting element according to claim 1, wherein a compressive stress is applied to the entire glass substrate.

4. The light emitting element according to claim 1, wherein the glass substrate comprises the one surface and another surface opposite to the one surface,
wherein the resin layer is positioned on the one surface side.

5. The light emitting element according to claim 1, wherein the glass substrate comprises the one surface and another surface opposite to the one surface,
wherein the resin layer is positioned on the another surface side.

6. The light emitting element according to claim 1, wherein light of the light emitting layer passes through the resin layer and is emitted to outside.

7. The light emitting element according to claim 1, wherein light of the light emitting layer is emitted to opposite side of the resin layer.

8. A light emitting element comprising:
a flexible plate-like portion; and
a fixation member fixing the flexible plate-like portion,
wherein the flexible plate-like portion comprises:
  a glass substrate;
  an organic functional layer comprising a light emitting layer, the organic functional layer being formed on one surface side of the glass substrate; and
  a resin layer having a thickness greater than that of the glass substrate,
wherein the fixation member fixes the flexible plate-like portion such that a surface side at which the resin layer is formed relative to the glass substrate is a convex surface,
wherein a center of a thickness direction of the glass substrate is closer to a concave surface that a center of a thickness direction of the flexible plate-like portion is, and
wherein a center of the thickness direction of the light emitting element is positioned in the glass substrate.

9. The light emitting element according to claim 8, wherein a compressive stress is applied to a region with a thickness of greater than one-half of the thickness direction of the glass substrate.

10. The light emitting element according to claim 8, wherein a compressive stress is applied to the entire glass substrate.

11. The light emitting element according to claim 8, wherein the glass substrate comprises the one surface and another surface opposite to the one surface,
wherein the resin layer is positioned on the one surface side.

12. The light emitting element according to claim 5, wherein the glass substrate comprises the one surface and another surface opposite to the one surface,
wherein the resin layer is positioned on the another surface side.

13. The light emitting element according to claim 8, wherein light of the light emitting layer passes through the resin layer and is emitted to outside.

14. The light emitting element according to claim 8, wherein light of the light emitting layer is emitted to opposite side of the resin layer.

15. A light emitting element comprising:
a flexible plate-like portion; and
a fixation member fixing the flexible plate-like portion,
wherein the flexible plate-like portion comprises:
  a glass substrate;
  an organic functional layer comprising a light emitting layer, the organic functional layer being formed on one surface side of the glass substrate; and
  a resin layer having a thickness greater than that of the glass substrate,
wherein the fixation member fixes the flexible plate-like portion such that a surface side at which the resin layer is formed relative to the glass substrate is a convex surface,
wherein a center of a thickness direction of the glass substrate is closer to a concave surface than a center of a thickness direction of the flexible plate-like portion is, and
wherein the center of the thickness direction of the flexible plate-like portion is positioned in the glass substrate.

16. The light emitting element according to claim 15, wherein a compressive stress is applied to a region with a thickness of greater than one-half of the thickness direction of the glass substrate.

17. The light emitting element according to claim 15, wherein a compressive stress is applied to the entire glass substrate.
18. The light emitting element according to claim 15, wherein the glass substrate comprises the one surface and another surface opposite to the one surface, wherein the resin layer is positioned on the one surface side.
19. The light emitting element according to claim 15, wherein the glass substrate comprises the one surface and another surface opposite to the one surface, wherein the resin layer is positioned on the another surface side.
20. The light emitting element according to claim 15, wherein light of the light emitting layer passes through the resin layer and is emitted to outside.
21. The light emitting element according to claim 15, wherein light of the light emitting layer is emitted to opposite side of the resin layer.

* * * * *